United States Patent [19]

Sakiyama et al.

[11] Patent Number: 5,383,145
[45] Date of Patent: Jan. 17, 1995

[54] DIGITAL FILTER AND DIGITAL SIGNAL PROCESSING SYSTEM

[75] Inventors: Shiro Sakiyama, Kadoma; Masakatsu Maruyama, Hirakata, both of Japan

[73] Assignee: Matsushita Electric Industrial Co., Ltd., Osaka, Japan

[21] Appl. No.: 136,024

[22] Filed: Oct. 14, 1993

[51] Int. Cl.[6] ............................................. G06F 15/31
[52] U.S. Cl. ......................... 364/724.16; 364/724.13
[58] Field of Search ..................... 364/724.16, 724.13; 333/18, 166

[56] References Cited

U.S. PATENT DOCUMENTS

| | | | |
|---|---|---|---|
| 4,893,264 | 1/1990 | Noll et al. | 364/724.16 X |
| 5,081,604 | 1/1992 | Tanaka | 364/724.16 |
| 5,252,932 | 10/1993 | Someya et al. | 364/724.16 X |

FOREIGN PATENT DOCUMENTS 63-42968  8/1988  Japan .
5-74394   3/1993  Japan .

*Primary Examiner*—Tan V. Mai
*Attorney, Agent, or Firm*—Wenderoth, Lind & Ponack

[57] ABSTRACT

In a direct type of finite impulse response (FIR) digital filter, direct type digital filters consisting a plurality of taps are used as a construction element of a digital filter. A pipeline structure is constructed between cascaded construction elements, and the sum and carry signals of the multi-input addition in the midst of the addition operation are transferred between cascaded construction elements. The number of gates, dissipation power, chip area and the like can be decreased as compared with a prior art inverted type digital filter. Further, a digital signal processing system such as a waveform equalizing system can be constructed using a direct type digital filter as mentioned above, and such a system includes a selector for selecting the output of the digital filter and an output in the midst of the delays in the digital filter.

10 Claims, 9 Drawing Sheets

DIGITAL FILTER AND DIGITAL SIGNAL PROCESSING SYSTEM

BACKGROUND OF THE INVENTION

1. Field of the Invention

The present invention relates to a digital filter and a digital signal processing system using a digital filter, such as a waveform equalizer, for filtering image signals, acoustic signals or the like.

2. Description of the Prior Art

Finite impulse response (FIR) digital filters have two types of structures as shown in FIGS. 1 and 2. FIG. 1 shows a prior art n-tap digital filter of the direct type structure, wherein reference numerals 61(1)-61(n-1) denote delays, reference numerals 62(1)-62(n) denote multipliers and reference numerals 63(1)-63(n) denote adders. In the direct type circuit structure shown in FIG. 1, an input data is delayed directly by the delays 61(1)-61(n) successively. The input data and the delayed data in each tap is multiplied by the prescribed coefficient by the multiplier 62(1)-62(n). The products of the multiplication at the n taps are summed successively by the adders 63(1)-63(n). In the first adder 63(1), the delayed signal is added to zero, while in each of the other adders, the output of the adder in the preceding tap is added to the input delayed signal in the tap. The total sum is output by the adder 63(n) at the n-th tap.

On the other hand, FIG. 2 shows a prior art n-tap digital filter of the inverted type structure, wherein reference numerals 61(1)-61(n-1) denote delays, reference numerals 62(1)-62(n) denote multipliers and reference numerals 63(1)-63(n) denote adders. In the inverted type circuit structure shown in FIG. 2, an input signal is multiplied by the multipliers 62(1)-62(n) by prescribed coefficients and the product of the multiplication is delayed by the delays 61(1)-61(n-1) successively.

The delays in the direct type structure are used for input data, while those in the inverted type structure are used to delay the result of the multiplication and the addition. Therefore, the bit width of the delays of the inverted type is wider than that of the direct type by the bit width of a multiplication coefficient for the multiplier. Therefore, the direct type structure is more advantageous due to a smaller number of the components used in the circuit of the digital filter.

However, in the direct type structure, it is difficult to add the results of multiplication of the number of "n" within one clock period. Further, if the above-mentioned operation is processed with a pipeline structure, the layout of the digital filter is difficult to design. That is, in a direct type digital filter made of many taps, it is impossible to add the results of each multiplication within one clock. As to the layout, if the multiplication results are collected to one position for the addition, the area required for circuit design becomes larger, and a full-custom design thereof is troublesome and inappropriate.

On the other hand, in the inverted type structure, it is possible to arrange basic units in an array regularly where a basic unit includes the multiplication and addition in one tap. Further, the delays also act as pipeline transistors for the addition operation. Then, the inverted type structure is appropriate for pipeline processing. Therefore, though the inverted type digital filter has larger components, it is adopted for most of custom chips.

A digital signal processing system such as a waveform equalizer system can be constructed with use of an FIR digital filter. FIG. 3 shows an example of a waveform equalizer system with the inverted type n-tap digital filter, wherein reference numerals 67(3)-67(n) denote delays, reference numeral 65 denotes a selector and reference numeral 66 denotes a controller for controlling the selector 65 and the multiplication coefficients of each tap.

In a digital signal processing system such as a wave equalizing system, the output of the digital filter is not provided until each multiplication coefficient is determined, and it is needed to output the input signal itself. The phase of the output of the input signal is needed to be matched with that of the output of the digital filter. Therefore, delays 67 are needed for the matching of the phase with the input signal. However, the delays 67 make the circuit size large.

As described above, the inverted type structure is used from the view points of the pipeline processing and the easiness of the layout though the direct type structure is more advantageous from the viewpoint of the number of components. If the inverted type structure is adopted, the reduction of the number of the components has a lower limit.

SUMMARY OF THE INVENTION

An object of the present invention is to provide a direct type digital filter wherein the pipeline processing is easy.

Another object of the present invention is to provide a direct type digital filter wherein the layout of the digital filter is easy.

A third object of the present invention is to provide a direct type digital filter wherein the number of the components of the digital filter is small.

A fourth object of the present invention is to provide a digital signal processing system having a compact size.

In one aspect of the present invention, an (n×m)-tap digital filter is constructed by using n-tap digital filters as construction units arranged in cascade. (the number of n-tap digital filters is "m".) Each n-tap digital filter comprises n-cascaded 1-tap digital filters. Each of the 1-tap digital filters comprises: a first type delay for delaying a first input data; a multiplier for multiplying the output data of the first type delay by a prescribed coefficient; and a second type delay each for delaying the output of the multiplier. The n-tap digital filter further comprises: an (n+2)-input adder for adding the outputs of the second type delays in the 1-tap digital registers by external sum and carry data and for supplying sum and carry data obtained in the midst of the addition operation; a first register for storing the output of the first type delay at the last in the cascade connection for phase matching; and second and third registers for storing the results or sum and carry obtained in the midst of the addition operation by the (n+2)-input adder. The output of the first register of the n-tap digital register is supplied to the n-tap digital filter in the following stage as the first input data and that the outputs of the second and third registers are supplied as input data to the (n+2)-input adder in the n-tap digital filter in the following stage.

Preferably, the (n+2)-input adder comprises a plurality of full adders, and each of the full adders being arranged near one of the 1-tap digital filters. Each of the full adders adds the output of the second type delay to sum and carry signals both from the 1-tap digital filter at the preceding stage in the cascade connection and supplies sum and carry signals to the 1-tap digital filter in the following stage in the cascade connection. An $(n \times m \times j)$-tap digital filter can be constructed by using the $(n \times m)$-tap digital filters as construction units arranged in cascade.

In another aspect of the present invention, an n-tap digital filter as a construction unit of an $(n \times m)$-tap digital filter comprises an $(n+1)$-input adder for adding the outputs of the second type delays in the 1-tap digital registers to a second input data from the external and a second register for storing the result of the addition by the $(n+1)$-input adder.

In a digital signal processing system according to the present invention, an $(n \times m)$-tap digital filter as mentioned above is used, and a selector is provided to select an output of the $(n \times m)$-tap digital filter and an output of an i-th delay $(0 \leq i \leq n \times m)$ of the $(n \times m)$-tap digital filter.

An advantage of a digital filter of the present invention is that a digital filter of direct type structure, which was not suitable for pipeline structure and has had a bad layout design previously, can be constructed simply by using a plurality of 1-tap registers as construction units.

Another advantage of a digital filter of the present invention is that gate number, dissipation power, chip area and the like are improved as compared to the prior art inverted type structure.

An advantage of the digital signal processing system such as a waveform equalizing system according to the present invention is that because a digital filter of the present invention is included, the system can be constructed simply.

BRIEF DESCRIPTION OF THE DRAWINGS

These and other objects and features of the present invention will become clear from the following description taken in conjunction with the preferred embodiments thereof with reference to the accompanying drawings, and in which.

EMBODIMENTS

Figure 4:
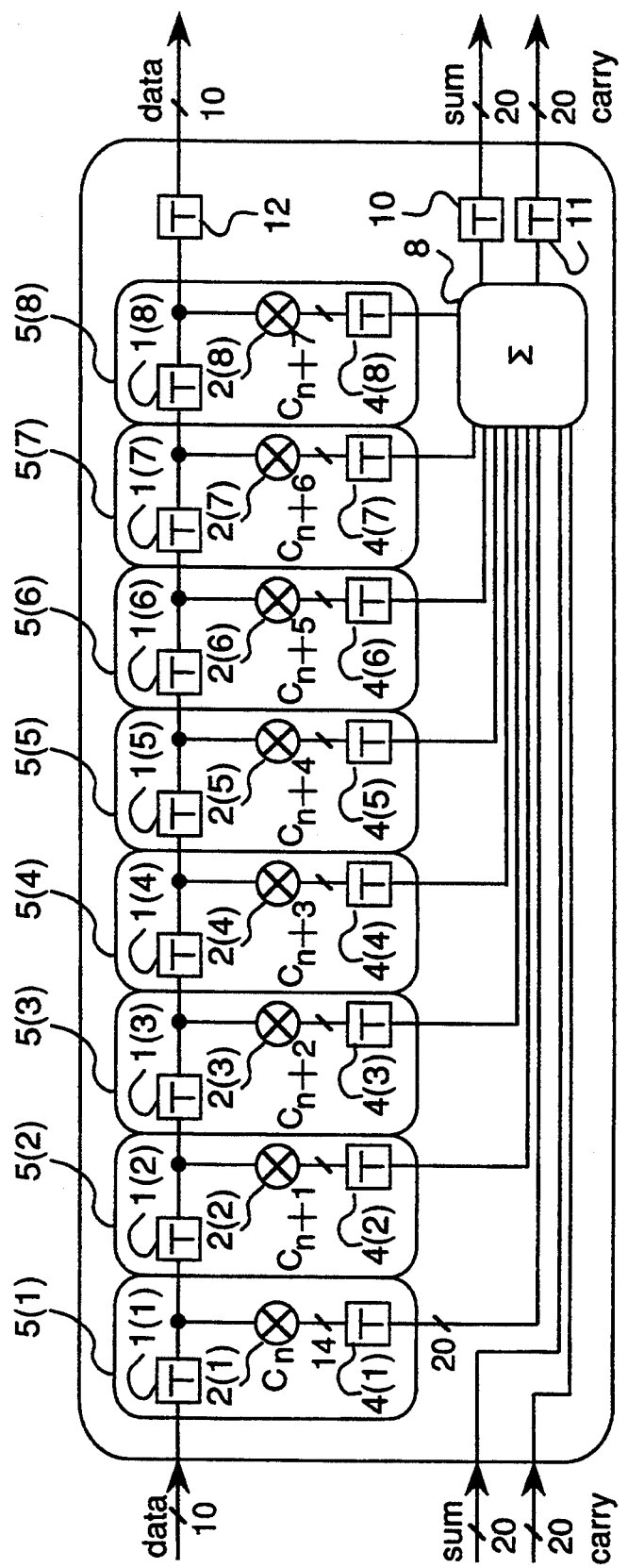
FIG. 4 is a diagram of an 8-tap digital filter of an embodiment of the present invention.
Figure 5:
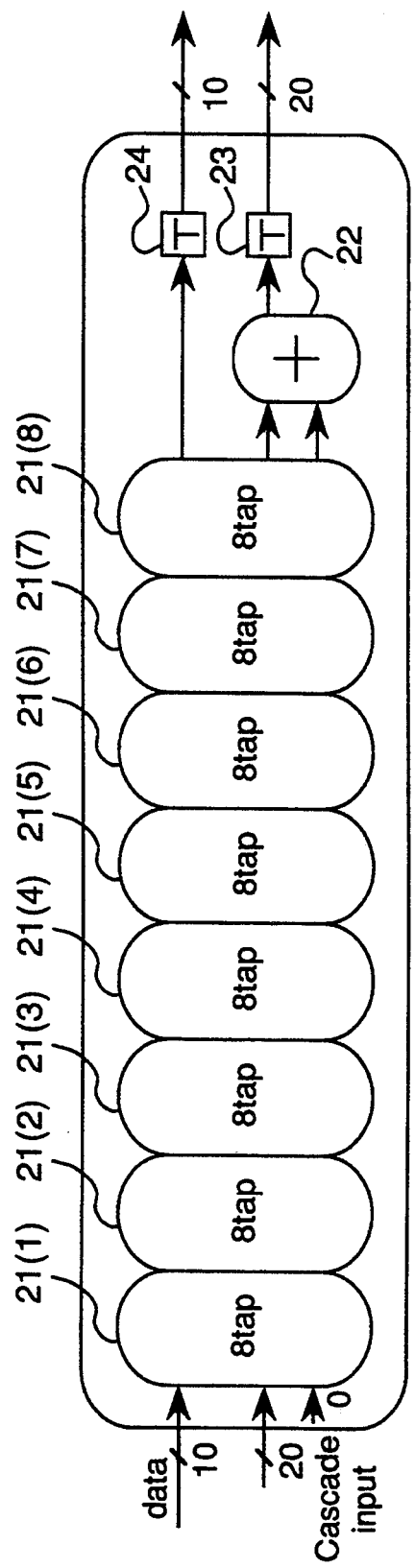
FIG. 5 is a diagram of a 64-tap digital filter of an embodiment of the present invention.

Referring now to the drawings, wherein like reference characters designate like or corresponding parts throughout the views, FIG. 4 shows a structure of a digital filter including direct type 8-tap digital filters which can be used as a primary construction unit. FIG. 5 shows the entire structure of a 64-tap digital filter with a cascade connection of a plurality of the primary construction units.

In the 8-tap digital filter shown in FIG. 4, reference numerals 1(1)–1(8) denote delays of eight stages for first input data of a 10-bit width. The delays 1(1)–1(8) are connected in series. The first delay 1(1) receives a first input data of a 10-bit width, while the last delay 1(8) sends a delayed data to a data relay 12 comprising a first register for storing the output of the delay 1(8) at the 8-th stage. Reference numerals 2(1)–2(8) denote eight multipliers for multiplying the output data of each delay 1(1)–1(8) by a prescribed coefficient $C_n$–$C_{n+7}$ for multiplication, and reference numerals 4(1)–4(8) denote delays. Reference numerals 5(1)–5(8) denote 1-tap digital filters, and each 1-tap digital filter 5(k) (k=1–8) includes a delay 1(k), a multiplier 2(k) and a delay 4(k). Reference numeral 8 denotes a 10-input adder for adding 2-output data of the eight multipliers 2 to external second and third input data (sum and carry) received from an external, preceding structural unit. The output data of the delay 1(k) is supplied to the multiplier 2(k), which sends the 20-bit delayed product to the 10-input adder 8. Reference numerals 10 and 11 denote pipeline delays comprising second and third registers for storing the results (that is, sum and carry) obtained in the midst of the addition of the 10-input adder 8 and for supplying them to a next primary structural unit.

The structure of the 8-tap digital filter shown in FIG. 4 has following favorable characteristics as construction units in the 64-tap digital filter shown in FIG. 5 in comparison with the prior art direct type digital filter.

(1) An 8-tap direct type digital filter is constructed as a construction unit, and pipeline registers 10 and 11 are included therein for the pipeline processing for the 64-tap digital filter shown in FIG. 5.

(2) The output of the 10-input adder 8 is not the final result (one output data) of the addition of eight data, but the results (two output data) or the sum and carry obtained in the midst of the operation.

(3) The data delay 12 for matching the phase is included in the digital filter, so that multi-stage dependency connection (or cascade connection) between the 8-tap direct type digital filters can be formed in the 64-tap digital filter.

By using the pipeline structure as mentioned in characteristic (1), the number of the steps of the gate delays needed for the addition of the results of the addition of all taps can be reduced to a large extent, and the above-mentioned characteristic (2) further reduces the number of the gate delay steps needed for the 10-input adder. Because the output of the 10-input adder 8 is supplied as two output data in the midst of the operation, the delay of the propagation of carry due to the bit width of the adder can be avoided. Further, as mentioned in characteristic (3), the 8-tap digital filters are used as primary construction units as will be explained below. The eight input signals of the results of the multiplication can be added to the other two input signals because the results (sum and carry) obtained in the midst of the addition are stored in the delays 10 and 11.

FIG. 5 shows a structure of a 64-tap digital filter constructed as the cascade connection of eight 8-tap digital filters 21(1)-21(8) shown in FIG. 4, and the 8-tap digital filters 21(1)-21(8) are used as primary construction units in the cascade connection. That is, the output of the first register 12 in a primary construction unit is supplied to another primary construction unit at the following stage as the first input data and the outputs of the second and third registers 10 and 11 in the primary construction unit are supplied as input data to the 10-input adder 8 at the another primary construction unit in the following stage. An adder 22 adds the two outputs (sum and carry) of the second and third registers 10 and 11 at the primary construction unit 21(8) in the final stage of the multi-stage dependency connection of the eight primary construction units, and a delay 23 is used as a fourth register for storing the result of the addition of the adder 22. Reference numeral 24 denotes a delay used as a fifth register for storing the result of the first register 12 at the construction unit in the last stage. The first 8-tap digital filter 21(1) can receive an input data from the delay 24 and the result received from the register 23 in a preceding digital filter. The carry data for the adder 8 in the first primary construction unit 21(1) is set as zero.

In the 64-tap digital filter shown in FIG. 5, the two outputs, sum and carry, propagated as the results in the midst of the addition operation are added finally at the adder 22. The result of the addition is stored in the delay 23, and the normal addition is completed.

As explained above, the above-mentioned problem on the adaptability of the pipeline processing of prior art direct-type digital filter can be solved, and a new type of 64-tap direct type digital filter can be provided.

Figure 6:
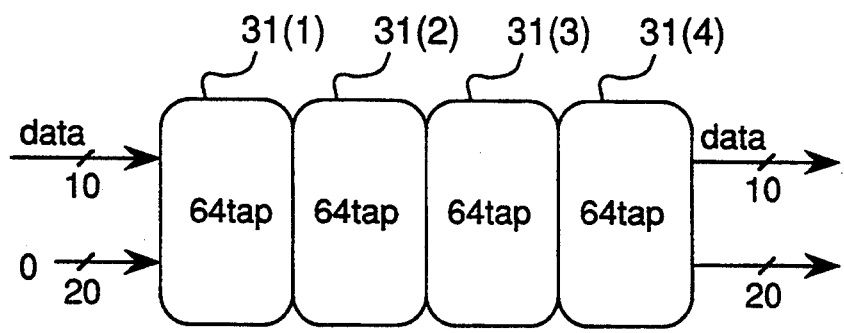
FIG. 6 is a diagram of a 256-tap digital filter of an embodiment of the present invention.

FIG. 6 shows an example of 256-tap digital filter by using four 64-tap digital filters 31(1)-31(4) shown in FIG. 5 as secondary construction units (LSIs). In the digital filter shown in FIG. 6, the outputs of the delays 23 and 24 in a 64-tap digital filter 31 shown in FIG. 5 are used as an input signal for the delay 1(1) and as an input signal for the adder 8 at the first primary construction unit 31 in a 64-tap digital filter in a following stage. The delay 24 shown in FIG. 5 acts as a delay for the matching of the phase. Then, by using the delay 24, the multi-stage dependency connection between the secondary construction units 31 shown in FIG. 4 becomes possible. In the cascade connection, an input data can be supplied from another 256-tap digital filter to the first 64-tap digital register 31(1), while the cascade input for the first secondary construction unit 31(1) is set as zero.

Figure 7:
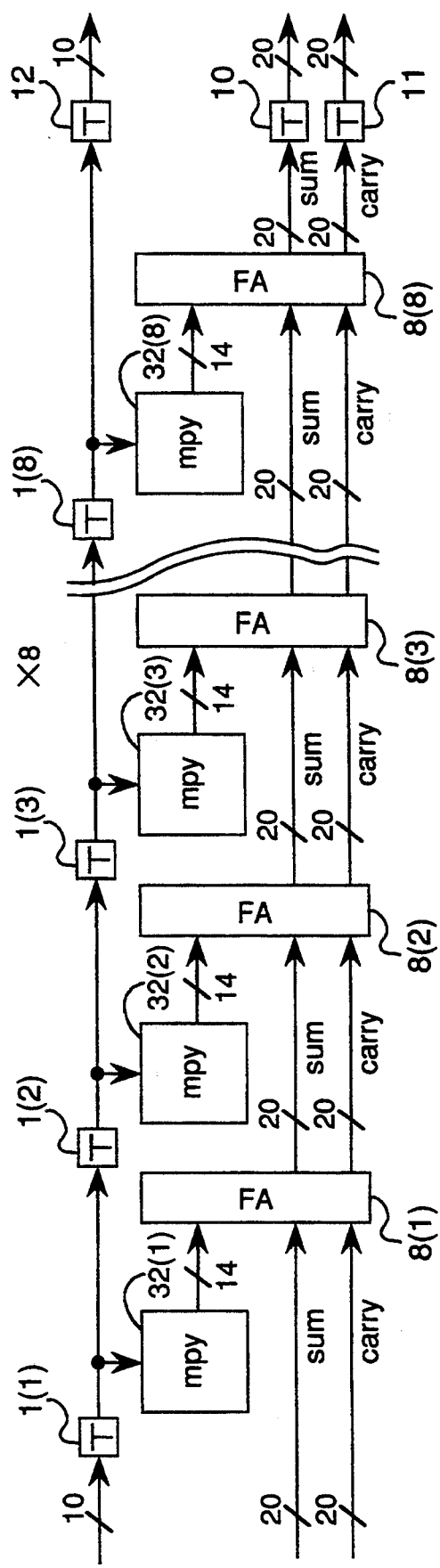
FIG. 7 is a diagram of an layout of an 8-tap digital filter of an embodiment of the present invention.

Next, the structure of the 10-input adder 8 shown in FIG. 4 will be explained further with reference to FIGS. 7 and 8. FIG. 7 shows a structure of the 8-tap digital filter shown in FIG. 4 wherein reference numerals 32(1)-32(8) denote 10×10 multipliers each including a multiplier 2(1)-2(8) and a delay 4(1)-4(8). The 10-input adder 8 shown in FIG. 4 comprises 20-bit full adders 8(1)-8(8), and the 20-bit full adders 8(1)-8(8) are arranged in the layout so as to be included in each 1-tap digital filter 5(1)-5(8). The sum and carry data generated by each 20-bit full adder 8(1)-8(8) are supplied as input data to the 20-bit full adder at the following tap. Thus, by including the 20-bit full adder 8(1)-8(8) of the 10-input adder 8 in each tap, the taps can be arranged as an array in the 8-tap direct type digital filter.

Figure 8:
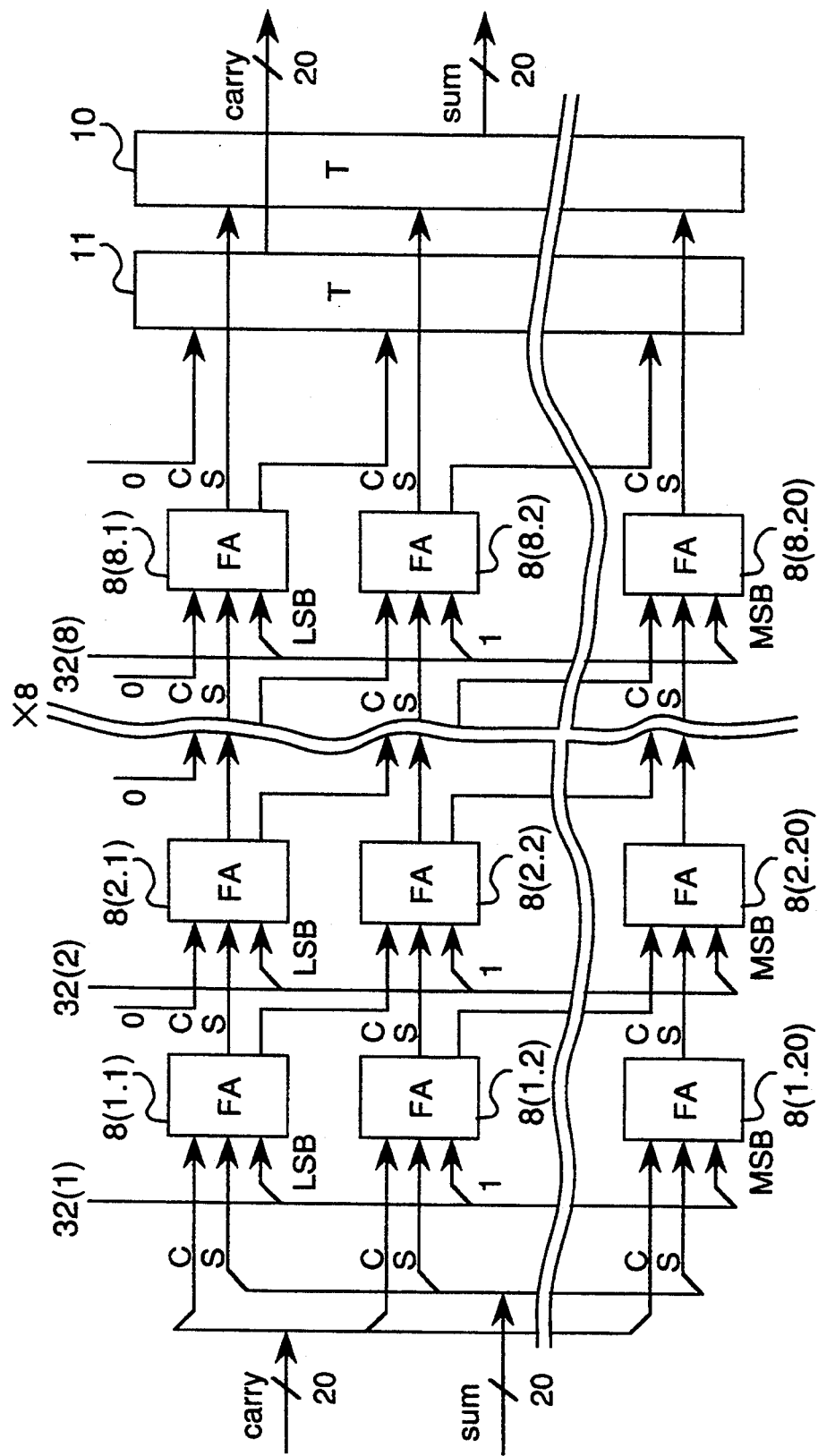
FIG. 8 is a circuit diagram of a 10-input adder of the 8-tap digital filter of an embodiment of the present invention.

With reference to FIG. 8, the structure of the 10-input full adder 8 is explained further in detail. FIG. 8 shows the circuit structure of the 10-input full adder 8(p) (p=1−8) shown in FIG. 7. In FIG. 8, reference numerals 8(p.q) (q=1−20) denote components in the unit of bit of the 20-bit full adder 8(p) (p=1−8) shown in FIG. 7. The sum and carry signals of 20-bit width generated by the 8-tap direct type digital filter in the previous stage and the product of the multiplication of the first multiplier 32(1) can be supplied to the 20-bit full adder 8(1) or the components 8(1.1)-8(1.20) in the first tap 5(1). A product sent from a 10×10 multiplier 32(p) (FIG. 7) is supplied to the components 8 (p.1)-8(p.20), while sum and carry signals S and C generated at a component 8(p.q) are supplied to a component 8((p+1).q) and to a component 8((p+1).(q+1)) in the next tap, respectively. The carry signals supplied to the components 8(p.1) (p=2−8) are set as zero, while the components 8(p.20) (p=1−8) at the most significant bit does not provide a carry signal. Final sum and carry signals S, C generated by the components 8(8.1)-8(8.20) at the 8-th tap are stored in the delays 10 and 11.

By adopting the circuit structure of the 10-input adder 8 as shown in FIG. 8 and by including the 20-bit full adders for each tap, the taps can be arranged as an array, and a simple layout structure as an array can be realized.

Further, by storing the final sum and carry signals in the delays 10 and 11, the delay of the propagation of the carry signals for the bit width of the 20-bit full adder 8 can be prevented.

By using the above-mentioned direct type digital filters, the problems of the adaptability of pipeline processing and the layout can be solved.

Next, an 8-tap digital filter of a different type of the present invention will be explained with reference to FIGS. 9 and 10. If the clock rate is slow and the propagation delay time of the 10-input adder 8 shown in FIG. 4 has a sufficient margin, an 8-tap direct type digital filter shown in FIG. 9 can be used as a primary construction unit. FIG. 10 shows the entire structure of a 64-tap digital filter obtained by using the cascade connection of the primary construction units.

Figure 9:
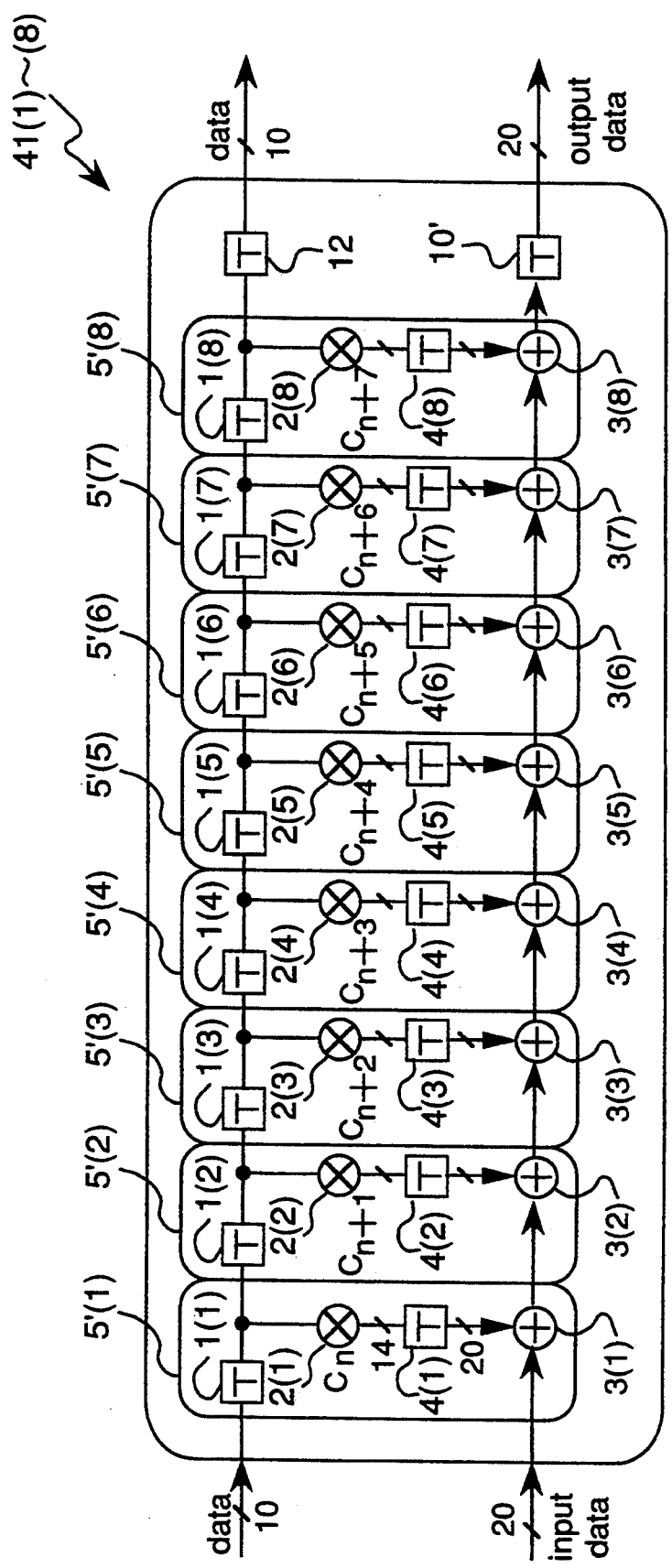
FIG. 9 is a diagram of an 8-tap digital filter of an embodiment of the present invention.
Figure 10:
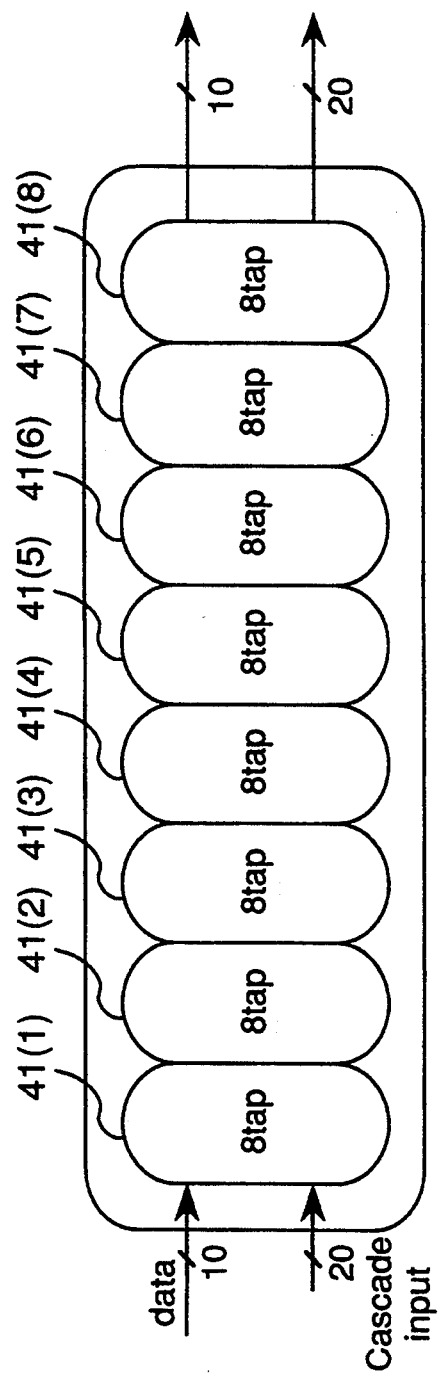
FIG. 10 is a diagram of a 64-tap digital filter of an embodiment of the present invention.

In FIG. 9, reference numerals 5'(1)-5'(8) denote 1-tap digital filters, and each 1-tap digital filter 5'(k) (k=1-8) comprises a delay 1(k), a multiplier 2(1)-2(8), a delay 4(1)-4(8) and a 2-input adder 3(1)-3(8). The delays 1(1)-1(8) are connected in series. The first delay 1(1) receives a first input data of 10-bit width, while the last delay 1(8) sends a delayed data to the data delay 12 for storing the output of the delay 1(8) at the 8-th stage in order to match the phase. The multiplier 2(1)-2(8) multiplies the output data of each delay 1(1)-1(8) by a prescribed coefficient $C_n$-$C_{n+7}$ for multiplication, and the 14-bit product is delayed by the delay 4(1)-4(8). The 2-input adder 3(1)-3(8) receives the output of the delay 4(1)-4(8) in the same tap and the 20-bit output of the 2-input adder 3(1)-3(8) in the previous tap. Further, the sum of the 2-input adder 3(8) at the last tap is supplied to a pipeline register 10' for the 8-tap direct type digital filter as a primary construction unit. The register 10' and the data relay 12 supplies the input data and the output data to the first tap of a following 8-tap digital register 41. Thus, as shown in FIG. 10, the multi-stage dependency connection between such 8-tap direct type digital filters 41(1)-41(8) becomes possible.

The eight 2-input adders 3 shown in FIG. 9 have the same function as a 9-input adder eventually, as will be understood in FIG. 9. As mentioned above, if the propagation delay time of the 9-input adder has a margin, this structure can be used practically. If it is compared with the digital filter shown in FIG. 4, the delay 11 can be omitted. Further, if the 64-tap digital filter shown in FIG. 10 is compared with that shown in FIG. 5, the 2-input adders 22 and the delays 23, 24 used in the digital filter shown in FIG. 5 can also be omitted as shown in FIG. 10. Then, the size of the entire circuit of the 64-tap digital filter shown in FIG. 10 can be reduced as compared with the digital filter shown in FIG. 5.

Figure 1:
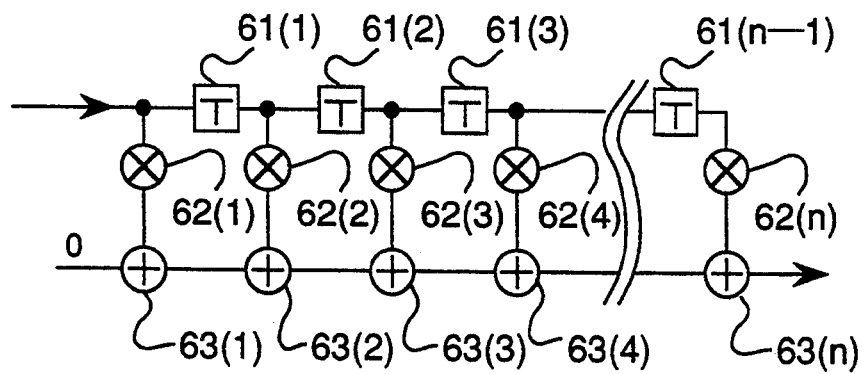
FIG. 1 is a diagram of a direct type prior art FIR type digital filter.
Figure 2:
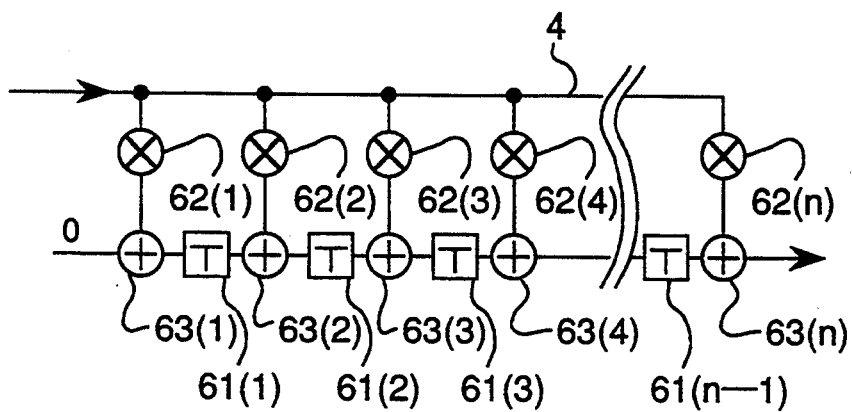
FIG. 2 is a diagram of an inverted type prior art FIR type digital filter.

Next, the number of gates of digital filters of the present invention is compared with that of the prior art inverted type 64-tap digital filter (FIG. 2). It is assumed here that the bit width of the input signal is 10 bits, that the bit width of the coefficient of multiplication is 10 bits, and that the output of the multiplication is rounded as 14 bits. The adders 3(1)–3(8) have a width of 20 bits to prevent overflow. In the digital filter shown in FIGS. 4 and 5, 210 delays can be omitted while in the embodiment shown in FIGS. 9 and 10, 370 delays can be omitted, as compared with the prior art inverted type digital filter.

In the above-mentioned embodiments, 10-bit coefficients of multiplication are used. If the bit width of the coefficient of multiplication is increased further, this effect becomes more remarkable.

Further, if a digital processing system such as a waveform equalizing system is constructed by using such a digital filter, a function to output the input signal itself of the digital filter is needed. In the function, the phase of the input signal has to be matched with that of the digital filter. As described above on the prior art, in the inverted type structure (refer FIG. 3), a delay 67 is needed for matching the phase with the input signal.

Table 1 summarizes the characteristics of digital filters of the present invention and of prior art direct type and inverted type digital filters.

TABLE 1

Comparison of characteristics of digital filters of this invention with those of prior art digital filters

| Type of digital filter | Direct type (prior art) | Inverted type (prior art) | FIGS. 5 and 6; and FIGS. 9 and 10 | FIGS. 7 and 8 |
|---|---|---|---|---|
| Bit width of delays | Narrow | Wide | Intermediate | Intermediate |
| Easiness of layout design | x | o | Δ | o |
| Adaptability of pipeline processing | x | o | o | o |

NB.
o: good,
Δ: fair, and
x: bad.

In the above-mentioned embodiments, an example of 64- and 256-tap digital filter including 8-tap digital filters as construction units are described. However, needless to say, the number of the taps can be increased or decreased, and any number of the construction units can be arrayed in a cascade connection.

Next, a digital signal processing system for filtering image signals, acoustic signals or the like can be constructed by including a direct type digital filter according to the present invention. The structure of such a system is explained below. In such a system, a selector is provided for selecting an output of the $(n \times m)$-tap digital filter and an output of an i-th delay $(0 \leq i \leq n \times m)$ of the $(n \times m)$-tap digital filter. Further, a controller is provided for controlling the output of the selector.

Figure 11:
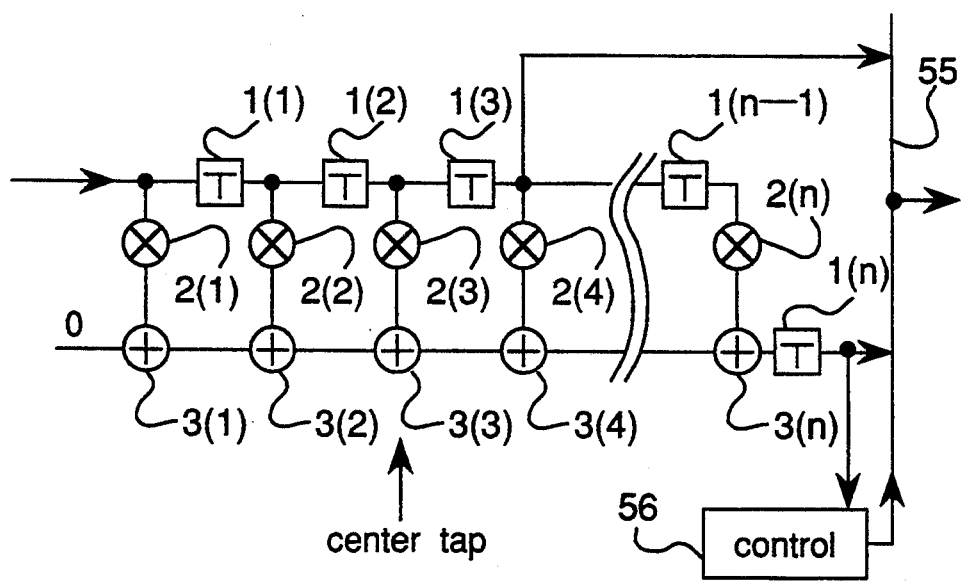
FIG. 11 is a diagram of a digital signal processing system using a digital filter of the present invention.

FIG. 11 shows an example of a waveform equalizing system including a direct type digital filter shown in FIGS. 9 and 10, as an example of a digital signal processing system. In FIG. 11, reference numeral 55 denotes a selector and reference numeral 56 denotes a controller for controlling the selector 55, the multiplication coefficients of each tap and the like.

Figure 3:
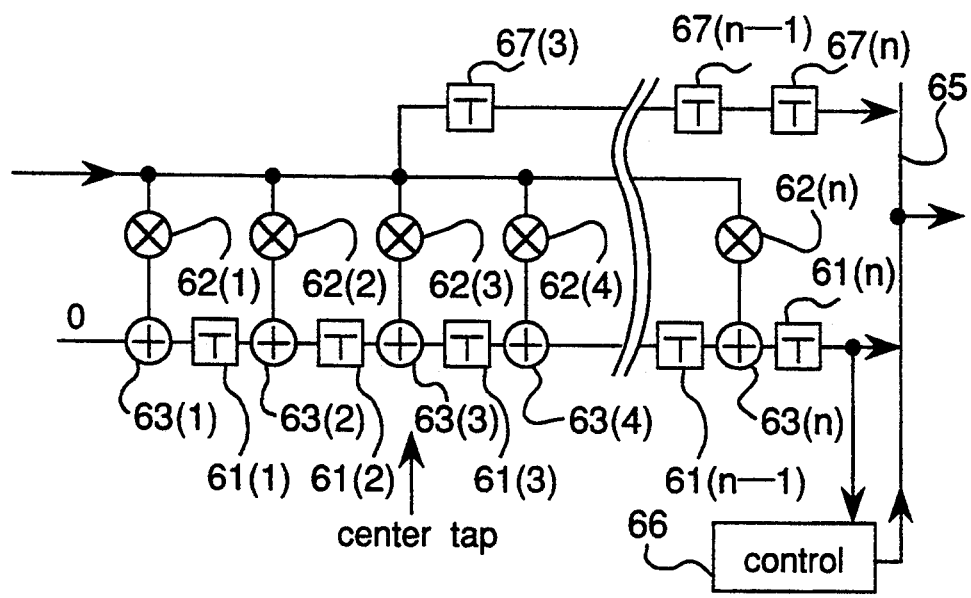
FIG. 3 is a diagram of a prior art digital signal processing system using an inverted type prior art digital filter.

By comparing the digital signal processing system shown in FIG. 11 with the prior art system shown in FIG. 3 using the inverted type structure, it is understood that a delay in FIG. 11 for the matching of the phase is obtained from the midst of a group of the delays 1(1)–1(n-1). Therefore, the delays 67 used in the prior art shown in FIG. 3 are not needed for the matching of the phase of the output of the digital filter with the input signal needed in the inverted type structure. Further, the size of the entire system can be reduced. That is, if the direct type digital filter according to the present invention is applied to the waveform equalizing system as shown in FIG. 11, the number of gates can be reduced by about 500. That is, a digital signal processing system can be produced by using the digital filters with a circuit size smaller than previously.

A waveform equalizing system may also be constructed by using a digital filter of the type shown in FIGS. 4 and 5, in FIGS. 7 and 8 or in FIG. 6.

It is advantageous that the entire system of such a digital signal processing system can be simplified by using one of the direct type digital filters of the above-mentioned embodiments so that the size of the circuit can be reduced more favorably.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as being defined by the appended claims unless they depart therefrom.

What is claimed is:

1. An $(n \times m)$-tap digital filter comprising a plurality of n-tap digital filters, the number of n-tap digital filters being "m"; each of the n-tap digital filters comprising a plurality of 1-tap digital filters, the number of 1-tap digital filters being "n"; each of the 1-tap digital filters comprising:

a first type delay for delaying a first input data, the first type delay being connected to a first type delay in another 1-tap filter so that a plurality of the first type delays are connected in series;

a multiplier for multiplying the output data of the first type delay by a prescribed coefficient; and a second type delay each for delaying the output of the multiplier;

the n-tap digital filter further comprising:

an $(n+2)$-input adder for adding the outputs of the second type delays in the 1-tap digital registers to second and third input data and for supplying second and third data obtained in the midst of the addition operation;

a first register for storing the output of the first type delay at the last in the cascade connection for phase matching; and second and third registers for storing the results obtained in the midst of the addition operation by the $(n+2)$-input adder;

wherein the n-tap digital registers are arranged to form multi-stage dependency connection so that the output of the first register of the n-tap digital register is supplied to the n-tap digital filter of the following stage as the first input data and so that the outputs of the second and third registers are supplied as input data to the (n+2)-input adder in the n-tap digital filter at the following stage;

the (n×m)-tap digital filter further comprising: an adder for adding the outputs of the second and third registers in the n-tap digital filter unit at the final stage in the multi-stage dependency connection.

2. The (n×m)-tap digital filter according to claim 1, further comprising:

a fourth register for phase matching for storing the output of the first type delay at the last of the first type delays connected in series in the last n-tap digital filter in the cascade connection; and a fifth register for storing the sum of the addition of the adder.

3. The (n×m)-tap digital filter according to claim 1, said (n+2)-input adders included in each of said n-tap digital filter comprising a plurality of full adders; each of the full adders being arranged near one of said 1-tap digital filters; each of the full adders adding the output of said second type delay to sum and carry signals both from said 1-tap digital filter at the preceding stage in the cascade connection and supplying sum and carry signals to said 1-tap digital filter in the following stage in the cascade connection; the first full adder in the full adders connected in series receiving external sum and carry signals.

4. The (n×m)-tap digital filter according to claim 3, each of said full adder comprising components in the unit of bit in correspondence to the bit width of said (n+2) adder, each of said component receiving sum and carry signals for the bit to be handled and sending sum and carry signals for addition to two relevant components in the components.

5. An (n×m×j)-tap digital filter comprising a plurality of (n×m)-tap digital filters in cascade connection, the number of (n×m)-tap digital filters being "j"; each of the (n×m)-tap digital filters comprising a plurality of n-tap digital filters, the number of n-tap digital filters being "m"; each of the n-tap digital filters comprising a plurality of 1-tap digital filters, the number of 1-tap digital filters being "n"; each of the 1-tap digital filters comprising:

a first type delay for delaying a first input data, the first type delay being connected to a first type delay in another 1-tap filter so that a plurality of the first type delays are connected in series;

a multiplier for multiplying the output data of the first type delay by a prescribed coefficient; and a second type delay each for delaying the output of the multiplier;

the n-tap digital filter further comprising;

an (n+2)-input adder for adding the outputs of the second type delays in the 1-tap digital registers to second and third input data and for supplying second and third data obtained in the midst of the addition operation;

a first register for storing the output of the first type delay at the last in the cascade connection for phase matching; and second and third registers for storing the results obtained in the midst of the addition operation by the (n+2)tap input adder;

wherein the n-tap digital registers are arranged to form a multi-stage dependency connection so that the output of the first register of the n-tap digital register is supplied to the n-tap digital filter of the following stage as the first input data and so that the outputs of the second and third registers are supplied as input data to the (n+2)-input adder in the n-tap digital filter at the following stage;

each of the (n×m)-tap digital filters further comprising:

a fourth register for phase matching for storing the output of the first type delay at the last of the first type delays connected in series in the last n-tap digital filter in the cascade connection;

an adder for adding the outputs of the second and third registers in the n-tap digital filter at the final stage in the multi-stage dependency connection; and a fifth register for storing the sum of the addition of the adder;

wherein the output of the fourth register of the (n×m)tap digital filter is supplied as a first input data to the (n×m)-tap digital filter at the next stage and the output of the fifth register of the (n×m)-tap digital filter is supplied as a second input data of the (n×m)-tap digital filter the next stage.

6. An (n×m)-tap digital filter comprising a plurality of n-tap digital filters, the number of n-tap digital filters being "m"; each of the n-tap digital filters comprising a plurality of 1-tap digital filters, the number of 1-tap digital filters being "n"; each of the 1-tap digital filter comprising:

a first type delay for delaying a first input data, the first type delay being connected to a first type delaying another 1-tap filter so that a plurality of the first type delays are connected in series;

a multiplier for multiplying the output data of the first type delays by a prescribed coefficient; and a second type delay each for delaying the output of the multiplier;

the n-tap digital filter further comprising:

an (n+1)-input adder for adding the outputs of the second type delays in the 1-tap digital registers to a second input data from the external;

a first register for storing the output of the first type delay at the last in the cascade connection for phase matching; and a second register for storing the result of the addition by the (n+1)-input adder;

wherein the n-tap digital registers are arranged to form a multi-stage dependency connection so that the output of the first register of the n-tap digital register is supplied to the n-tap digital filter of the following stage as the first input data and so that the output of the second register is supplied as input data to the (n+1)-input adder in the n-tap digital filter at the following stage.

7. The (n×m)-tap digital filter according to claim 6, wherein the bit width of the output data of said multipliers is equal to or larger than that of said first input data and that of said second and third input data.

8. The (n×m)-tap digital filter according to claim 6, said (n+1)-input adder comprising a plurality of 2-input adders of the number "n" connected in series, the 2-input adders being arranged in a 1-to-1 correspondence with respect to the 1-tap digital filters connected in series, one of the 2-input adders adding the output of the preceding 2-input adder in the series connection with the corresponding second type delay.

9. A digital signal processing system comprising:
an $(n \times m)$-tap digital filter;
a selector for selecting an output of the $(n \times m)$-tap digital filter or an output of an i-th delay $(0 \leq i \leq n \times m)$ of the $(n \times m)$-tap digital filter; and
a controller for controlling the output of the selector;
the $(n \times m)$-tap digital filter comprising a plurality of n-tap digital filters, the number of n-tap digital filters being "m"; each of the n-tap digital filters comprising a plurality of 1-tap digital filters, the number of 1-tap digital filters being "n"; each of the 1-tap digital filter comprising;
a first type delay for delaying a first input data, the first type delay being connected to a first type delay in another 1-tap filter so that a plurality of the first type delays being connected in series;
a multiplier for multiplying the output data of the first type delay by a prescribed coefficient; and
a second type delay each for delaying the output of the multiplier;
the n-tap digital filter further comprising:
an (n+2)-input adder for adding the outputs of the second type delays in the 1-tap digital registers to second and third input data and for supplying second and third data obtained in the midst of the addition operation;
a first register for storing the output of the first type delay at the last in the cascade connection for phase matching; and
second and third registers for storing the results obtained in the midst of the addition operation by the (n+2)input adder;
wherein the n-tap digital registers are arranged to form a multi-stage dependency connection so that the output of the first register of the n-tap digital register is supplied to the n-tap digital filter of the following stage as the first input data and so that the outputs of the second and third registers are supplied as input data to the (n+2)-input adder in the n-tap digital filter at the following stage;

the $(n \times m)$-tap digital filter further comprising: an adder for adding the outputs of the second and third registers in the n-tap digital filter unit at the final stage in the multi-stage dependency connection.

10. A digital signal processing system comprising:
an $(n \times m)$-tap digital filter;
a selector for selecting an output of the $(n \times m)$-tap digital filter or an output of an i-th delay $(0 \leq i \leq n \times m)$ of the $(n \times m)$-tap digital filter; and
a controller for controlling the output of the selector;
the $(n \times m)$-tap digital filter comprising a plurality of n-tap digital filters, the number of n-tap digital filters being "m"; each of the n-tap digital filters comprising a plurality of 1-tap digital filters, the number of 1-tap digital filters being "n"; each of the 1-tap digital filter comprising:
a first type delay for delaying a first input data, the first type delay being connected to a first type delay in another 1-tap filter so that a plurality of the first type delays are connected in series;
a multiplier for multiplying the output data of the first type delays by a prescribed coefficient; and
a second type delay each for delaying the output of the multiplier;
the n-tap digital filter further comprising:
an (n+1)-input adder for adding the outputs of the second type delays in the 1-tap digital registers to a second input data from the external;
a first register for storing the output of the first type delay at the last in the cascade connection for phase matching; and
a second register for storing the result of the addition by the (n+1)-input adder;
wherein the n-tap digital registers are arranged to form a multi-stage dependency connection so that the output of the first register of the n-tap digital register is supplied to the n-tap digital filter of the following stage as the first input data and so that the output of the second register is supplied as input data to the (n+1)-input adder in the n-tap digital filter at the following stage.

* * * * *